(12) United States Patent
Newman et al.

(10) Patent No.: US 6,937,481 B1
(45) Date of Patent: Aug. 30, 2005

(54) APPARATUS FOR HOLDING CARDS IN A COMPUTER AND METHOD OF USING SAME

(75) Inventors: Norman K. Newman, Hatfield, PA (US); Keith D. Mease, Gibbstown, NJ (US); Terry W Louth, Narvon, PA (US)

(73) Assignee: Unisys Corporation, Blue Bell, PA (US)

( * ) Notice: Subject to any disclaimer, the term of this patent is extended or adjusted under 35 U.S.C. 154(b) by 228 days.

(21) Appl. No.: 10/390,137

(22) Filed: Mar. 17, 2003

(51) Int. Cl.[7] .............................. H05K 7/14; H05K 7/16
(52) U.S. Cl. ...................... 361/801; 361/726; 361/732; 361/747; 361/759
(58) Field of Search ................................. 361/740, 726, 361/732, 747, 759, 801, 796, 797, 798, 752; 312/215, 216, 222

(56) References Cited

U.S. PATENT DOCUMENTS

| | | | |
|---|---|---|---|
| 5,317,483 A * | 5/1994 | Swindler ..................... | 361/801 |
| 5,601,349 A * | 2/1997 | Holt ........................ | 312/265.6 |
| 6,269,007 B1 * | 7/2001 | Pongracz et al. ........... | 361/759 |
| 6,356,441 B1 * | 3/2002 | Claprood ................... | 361/685 |
| 6,608,765 B2 * | 8/2003 | Vier et al. .................. | 361/801 |
| 6,618,264 B2 * | 9/2003 | Megason et al. ........... | 361/759 |
| 6,693,802 B2 * | 2/2004 | Vier et al. .................. | 361/801 |
| 6,738,261 B2 * | 5/2004 | Vier et al. .................. | 361/740 |

* cited by examiner

Primary Examiner—Randy Gibson
Assistant Examiner—Dameon E. Levi
(74) Attorney, Agent, or Firm—Lise A. Rode; Mark T. Starr; RatnerPrestia

(57) ABSTRACT

A computer is provided including a chassis at least partially defining an interior for housing a plurality of cards and a clip having an end portion pivotally mounted to the chassis at a point of rotation, the clip having of a latch at an end portion opposite the point of rotation. The latch has a recess to receive a portion of a card which is placed into the chassis, the recess being expandable from a securing position in which a portion of a card is secured with respect to the chassis and a releasing position in which the latch can release the portion of the card, wherein the latch is biased in its securing position. Also included as a part of the invention is an arm extending into the chassis when the clip is in its closed position to interact with a sensor in the chassis when the clip is in its closed position. Further included is a method of releasing cards from a computer.

21 Claims, 17 Drawing Sheets

APPARATUS FOR HOLDING CARDS IN A COMPUTER AND METHOD OF USING SAME

FIELD OF THE INVENTION

The present invention relates to computer assemblies and more specifically to mechanisms for holding cards in the computer module.

BACKGROUND OF THE INVENTION

Often it is desirable to access, remove, or replace one card of a computer system while the computer remains operational. These cards are typically I/O cards, PCI cards, or other such pieces of hardware. Typically a plurality of these cards are present within a console or module, and often operate in pairs of cards, each one of the pair mirroring the activity of the other so as to allow removal of one without interrupting the activity of the computer as a whole. This removal can become necessary for any of a number of reasons, including maintenance, troubleshooting, and upgrades. As such, in order to access a card, it may be desirable to provide for access and release of that card alone.

One problem with known devices for holding individual cards in place relates to the use of brackets or holding means that use screws or other removable fasteners. In such cases, removing a card from an operating computer requires the use of tools. Another problem involves the risk associated with metal screws falling into the computer during removal or replacement of the screw. Still yet another problem relates to the potential of pulling an active card from the computer and causing shutdown or other operational problems. Even in the event that inadvertent shutdown is prevented by other means, such other means often require the entire computer system (or at least a substantial portion of the system) to be shut down to access the desired components.

Accordingly, there remains a need for an apparatus that can provide for access and release of printed circuit cards while overcoming one or more of the disadvantages associated with conventional mechanisms.

SUMMARY OF THE INVENTION

The present invention provides a computer comprising a chassis at least partially defining an interior for housing a plurality of cards. The chassis includes at least one clip having an end portion pivotally mounted to the chassis at a point of rotation, wherein the clip is comprised of a latch at an end portion opposite the point of rotation. The latch has a recess to receive a portion of a card which is placed into the chassis, the recess being expandable from a securing position in which a portion of a card is secured with respect to the chassis and a releasing position in which the latch can release the portion of the card. The latch is biased in its securing position.

Also included in an alternative embodiment is a computer having a chassis at least partially defining an interior for housing a plurality of cards, a clip having an end portion pivotally mounted to the chassis at a point of rotation, wherein the clip is comprised of a latch at an end portion of the clip opposite the point of rotation and an arm extending into the interior of the chassis to interact with a sensor in the chassis. The arm is moveable with respect to the sensor between an operative position in which the arm interacts with the sensor to indicate to the computer that the card is operative and an inoperative position in which the arm interacts with the sensor to indicate to the computer that the card is inoperative.

Also included in the invention is a method of releasing a card from an operating computer comprising the steps of moving a latch of a clip from a securing position in which a portion of a card is secured with respect to the computer to a releasing position in which the latch can release the portion of the card, and pivoting the clip with respect to the computer from a closed position in which an arm of the clip is detected by a sensor to an open position in which the absence of the arm of the clip is detected by the sensor. Included in this method may be the removal of the card and the corresponding replacement of the card removed.

BRIEF DESCRIPTION OF THE DRAWINGS

In order that the invention may be more fully understood, exemplary embodiments will now be described with reference to the accompanying drawings, in which.

DETAILED DESCRIPTION OF THE INVENTION

Figure 1:
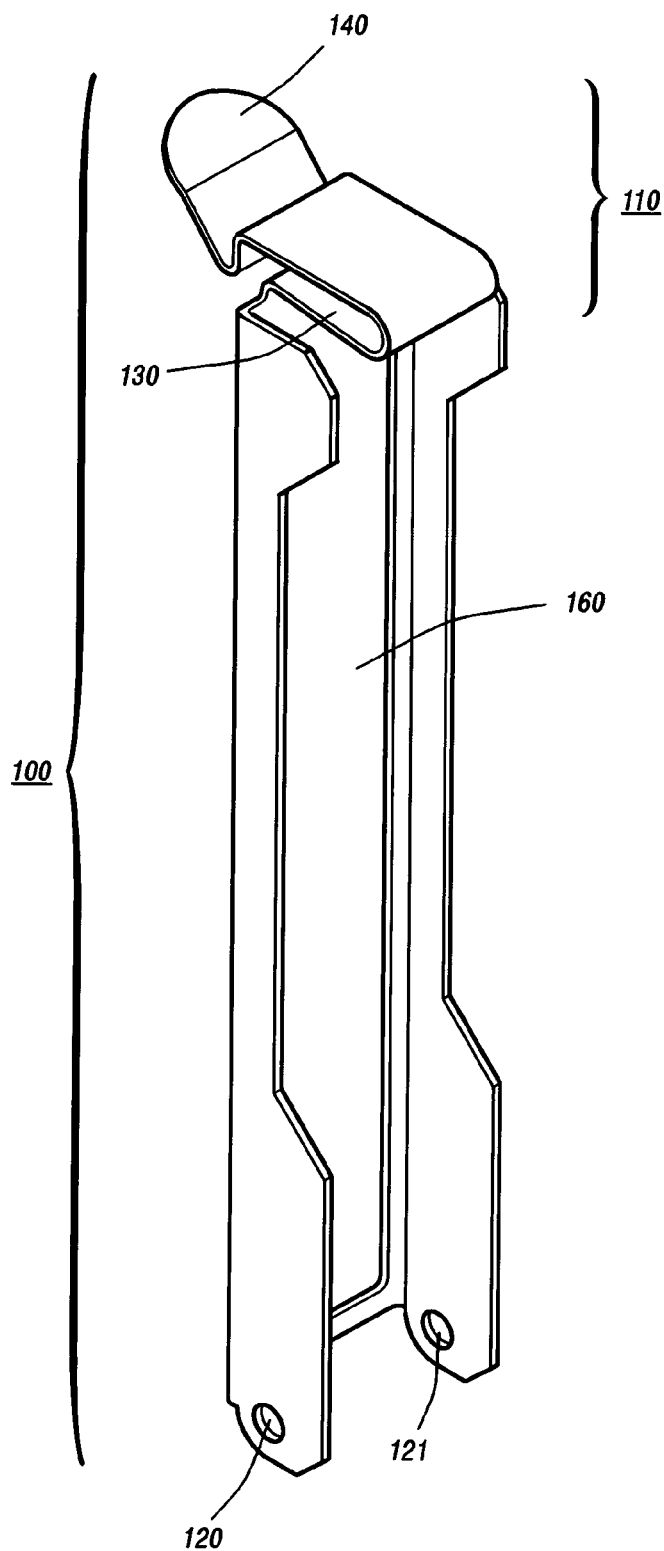
FIG. 1 is a perspective view of an exemplary embodiment of a clip according to aspects of the present invention.

An exemplary embodiment of the invention includes a computer having a chassis at least partially defining an interior for housing a plurality of cards. The chassis includes at least one clip, preferably a plurality of clips for a plurality of cards, each card having its own respective clip. Each clip has an end portion pivotally mounted to the chassis at a point of rotation, the clip comprised of a latch at an end portion opposite the point of rotation. The latch has a recess to receive a portion of a card which is placed into the chassis, the recess being expandable from a securing position in which a portion of a card is secured with respect to the chassis and a releasing position in which the latch can release the portion of the card. The latch is biased in its securing position.

Referring generally to the Figures, the present invention provides a computer comprising a chassis such as chassis 900 at least partially defining an interior for housing a plurality of cards such as card 930. The chassis includes at least one clip 100 having an end portion pivotally mounted to the chassis 900 at a point of rotation such as the axis defined by holes 120 and 121, wherein the clip 100 is comprised of a latch 110 at an end portion opposite the point of rotation. The latch 110 has a recess 130 to receive a portion 950 of a card 930 which is placed into the chassis 900, the recess 130 being expandable from a securing position (FIG. 1, for example) in which a portion 950 of a card 930 is secured with respect to the chassis 900 and a releasing position (FIG. 3, for example) in which the latch 110 can release the portion 950 of the card 930. The latch 110 is biased in its securing position.

The clip 100 optionally includes an arm 400 extending into the interior of the chassis 900 to interact with a sensor 970/980 in the chassis 900. The arm 400 is moveable with respect to the sensor between an operative position (FIG. 15, for example) in which the arm 400 interacts with the sensor to indicate to the computer that the card 930 is operative and an inoperative position (FIG. 14, for example) in which the arm 400 interacts with the sensor to indicate to the computer that the card 930 is inoperative.

In use, a card 930 can be released from an operating computer by moving the latch 110 of the clip 100 from the securing position to the releasing position and pivoting the clip 100 with respect to the computer from a closed position in which the arm 400 of the clip 100 is detected by the sensor to an open position in which the absence of the arm 400 of the clip 100 is detected by the sensor. The card 930 may then be removed from the computer for replacement or repair.

Figure 2:
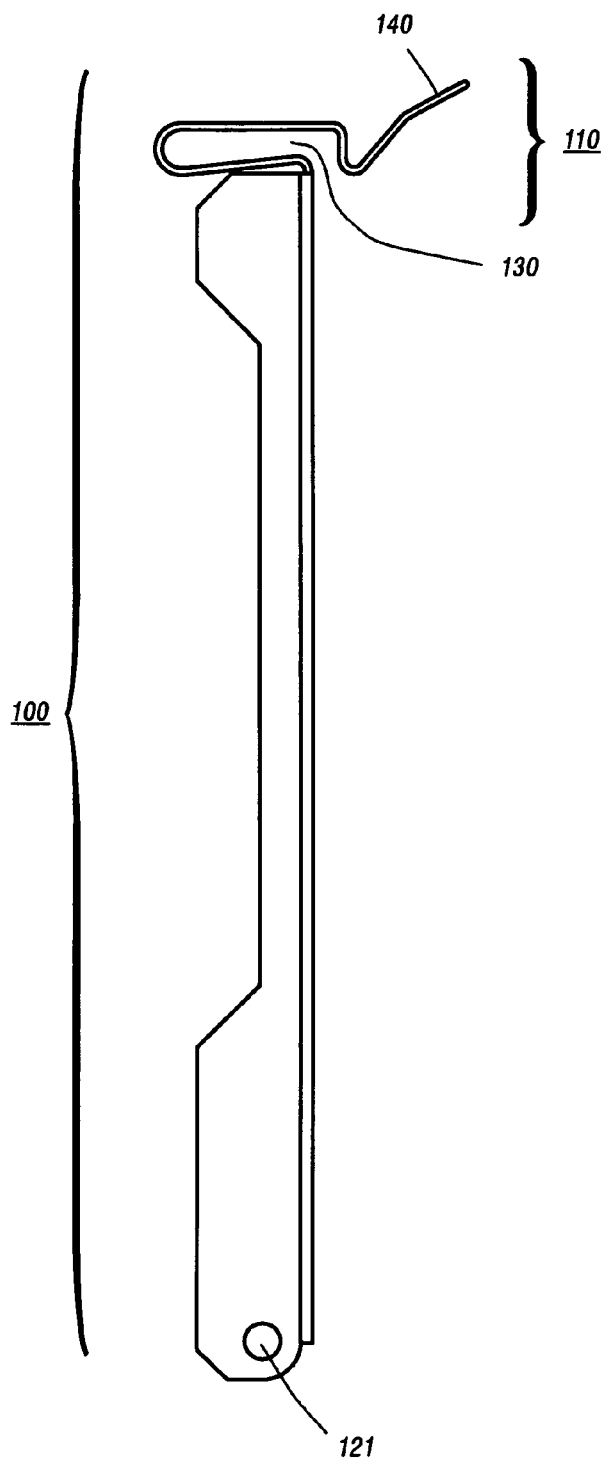
FIG. 2 is a side view of the clip shown in FIG. 1.

FIGS. 1 and 2 show an embodiment of the clip described above, in which clip 100 has latch 110 disposed at one end portion and holes 120 and 121 to allow a shaft (not shown in FIGS. 1 and 2, but see FIG. 9, below) to pass therethrough and create a point of rotation at the opposite end portion of the clip 100. FIG. 2 is a side view of clip 100 shown in FIG. 1.

Figure 3:
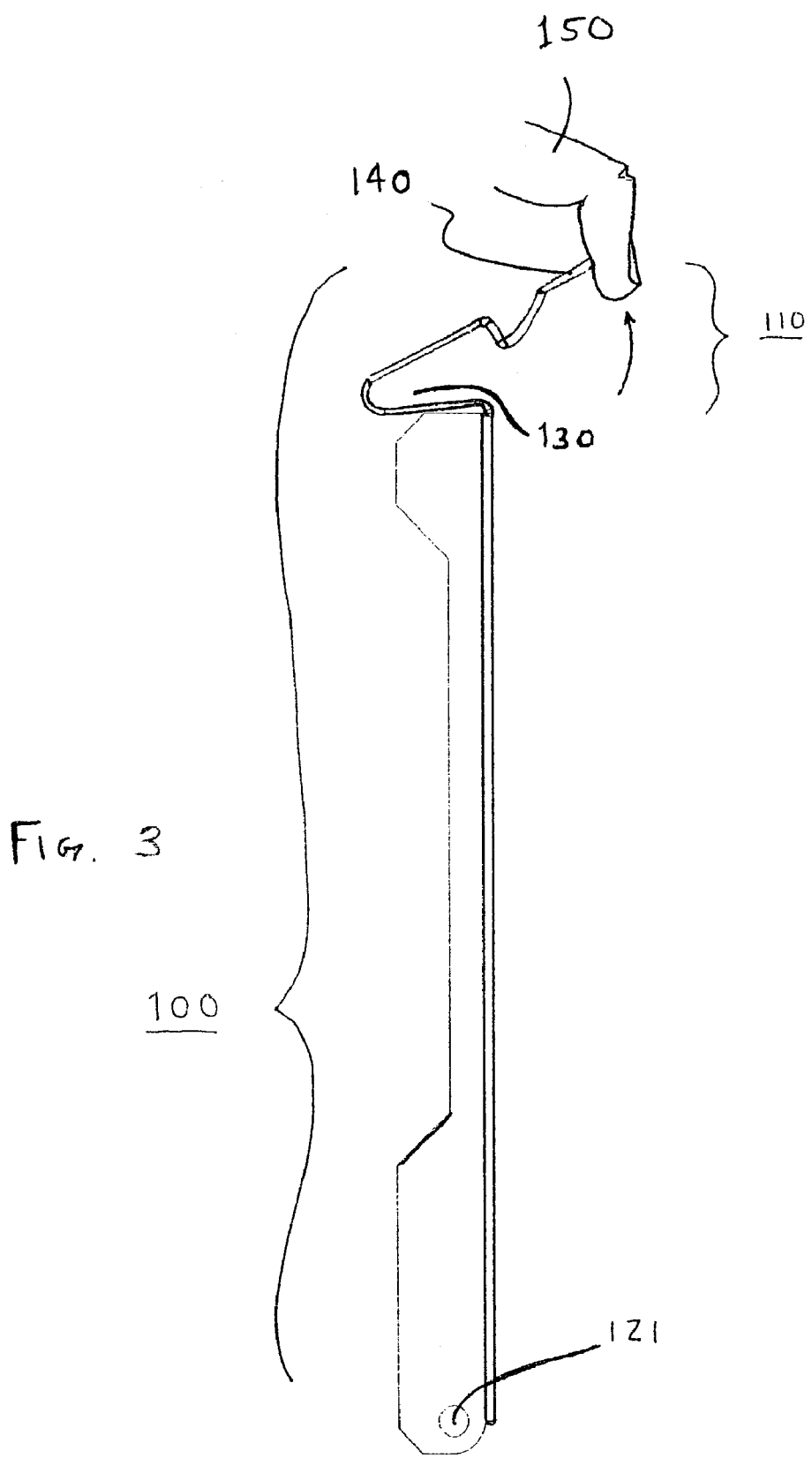
FIG. 3 is a side view of the clip shown in FIG. 1 with a user's finger pulling a latch into its releasing position.

FIG. 1 also shows recess 130 which is shaped to allow a portion of a card which is to be held in place by clip 100 to enter recess 130 and thereby be held in place. This aspect will be seen in more detail in the figures and discussion presented below. Generally, latch 110 is biased in the position shown in FIGS. 1 and 2, known herein as the securing position, and can be opened upon having a force applied to tab 140, typically by a user's finger or a tool such as a screwdriver, thereby opening the latch from its securing position in which a portion of a card is secured with respect to the chassis to its releasing position in which the latch can release the portion of the card. This is shown in FIG. 3, whereby a user's finger 150 applies a force to open latch 110 against its biased closing force in the direction of the arrow shown.

The clip may be made of any of a variety of suitable materials, including plastics and metal, but is preferably constructed from a single piece of stamped metal. Carbon steel is the preferred metal, although stainless and others could be used.

Figure 4:
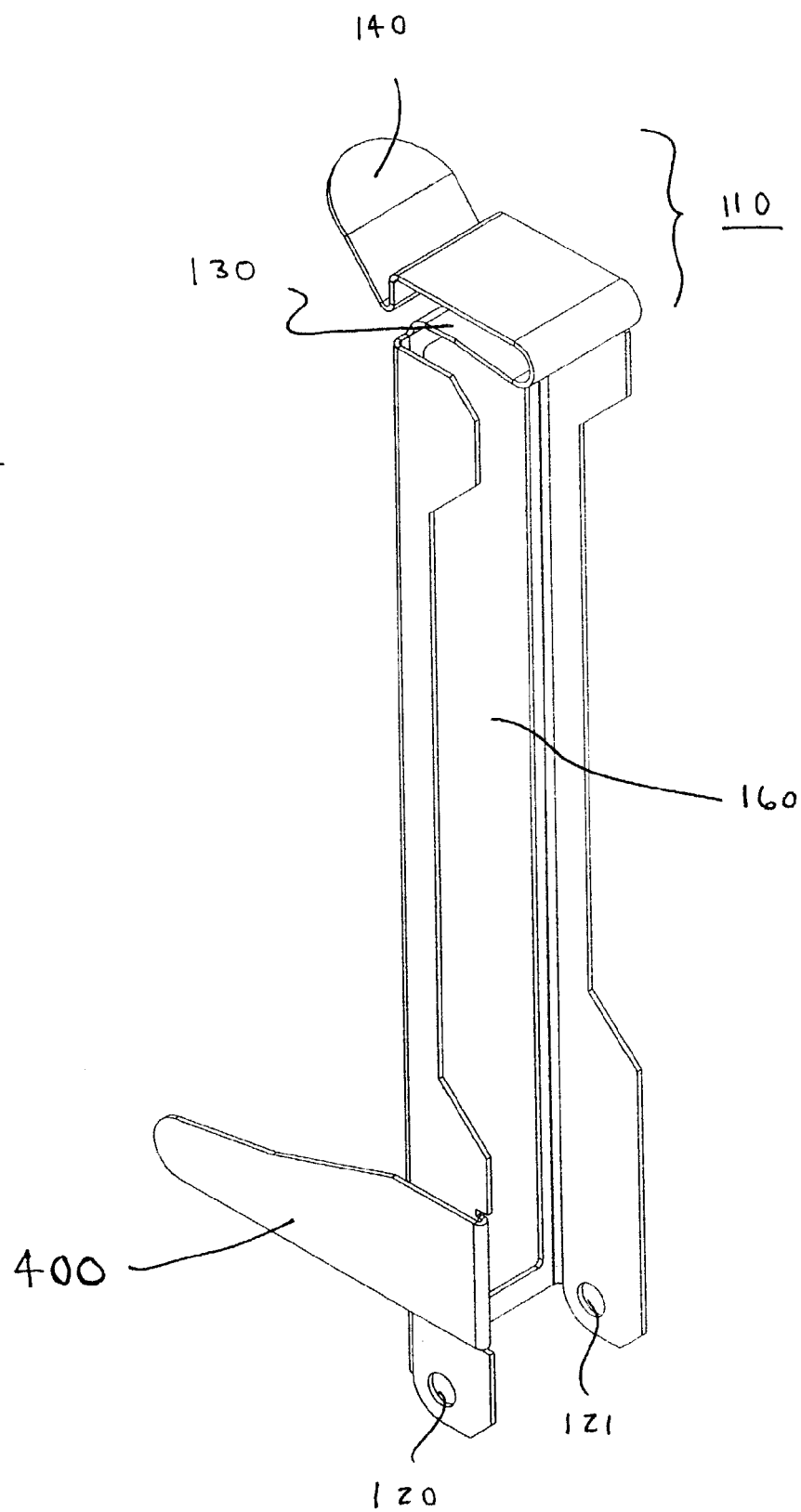
FIG. 4 is a perspective view of another exemplary embodiment of the invention, which uses an arm that extends into a computer chassis according to aspects of this invention.
Figure 5:
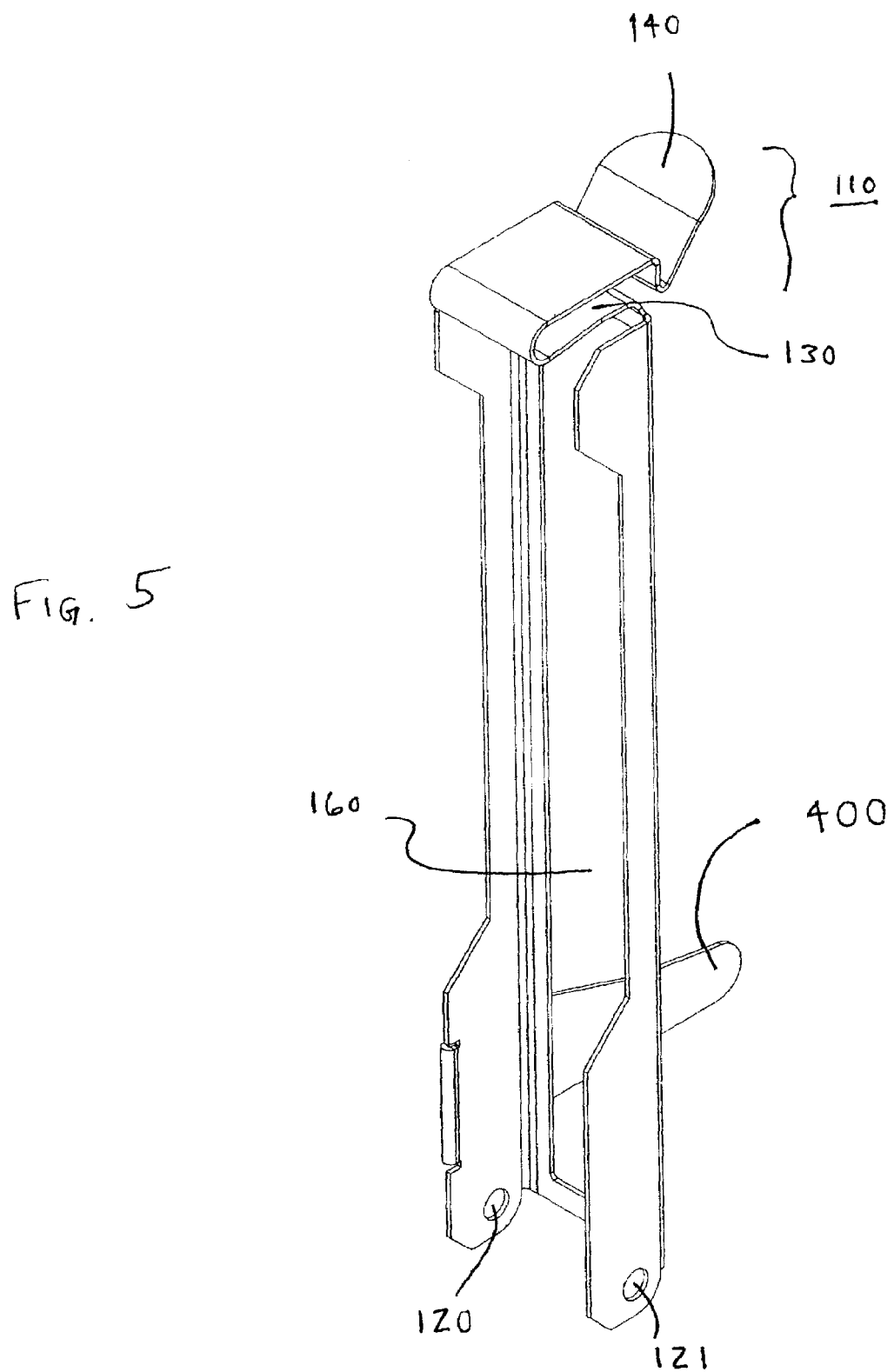
FIG. 5 is an opposite perspective view of the clip shown in FIG. 4.
Figure 6:
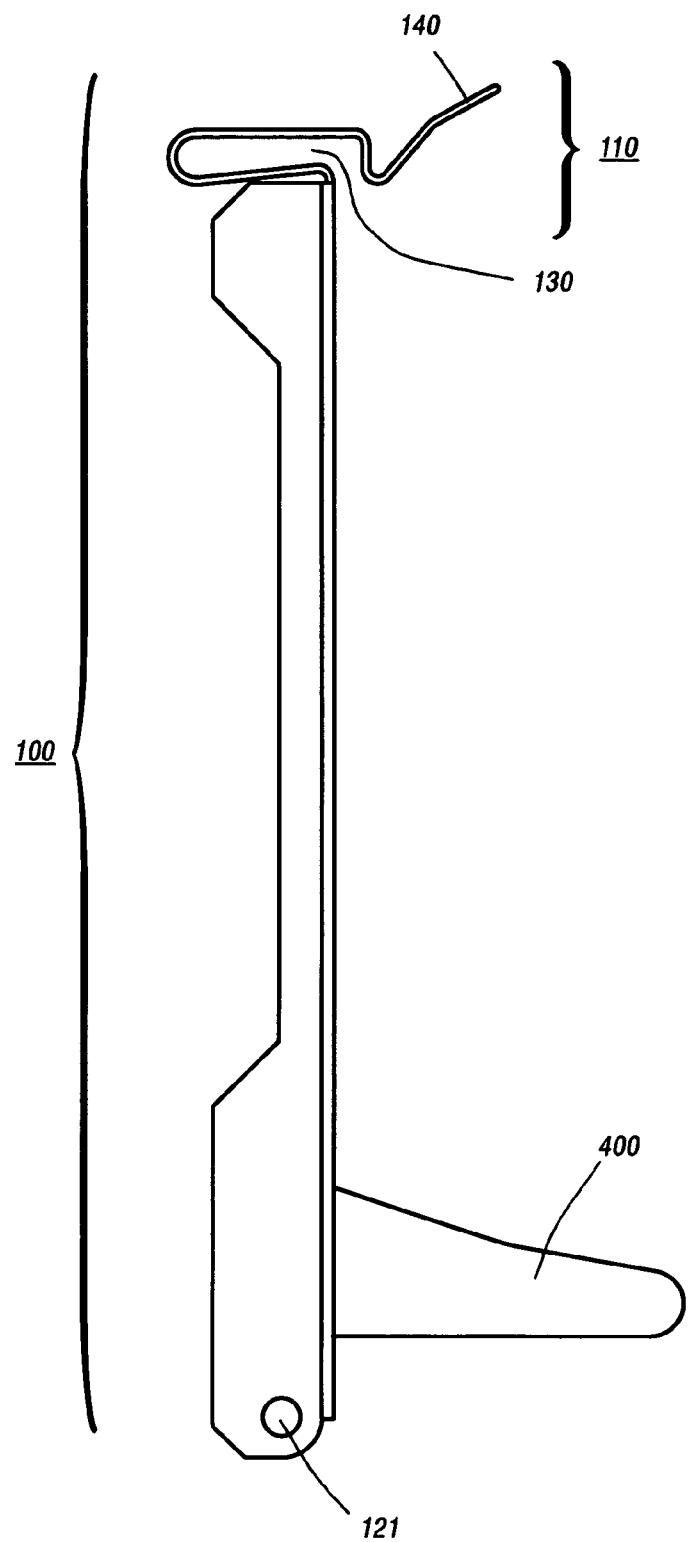
FIG. 6 is a side view of the embodiment shown in FIG. 4.
Figure 7:
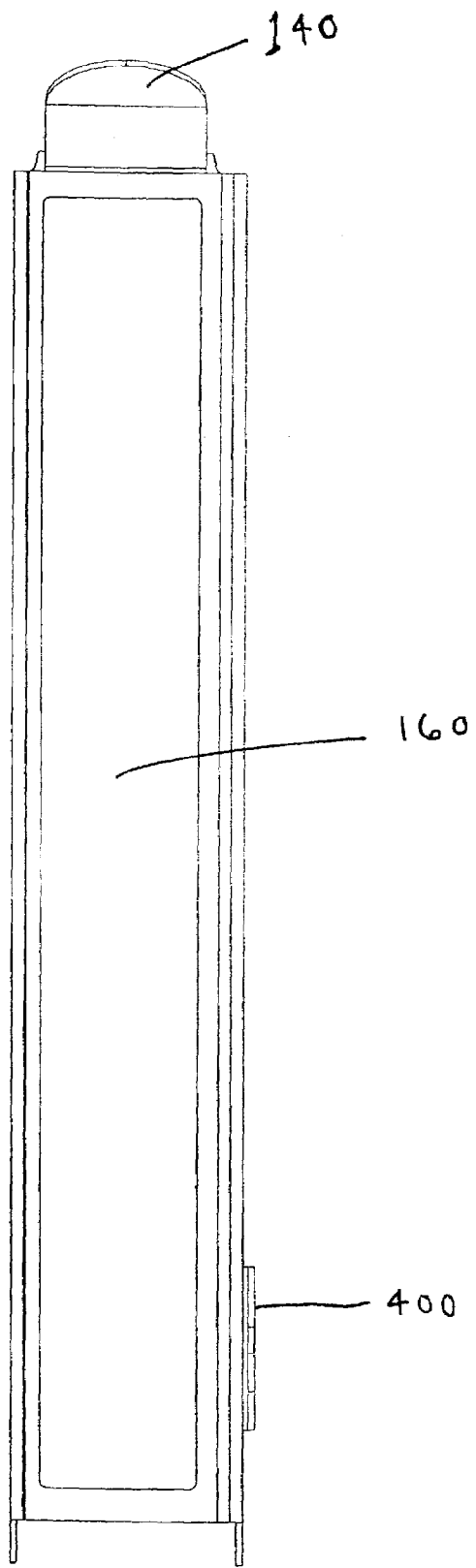
FIG. 7 is a front view of the embodiment shown in FIG. 4.
Figure 8:
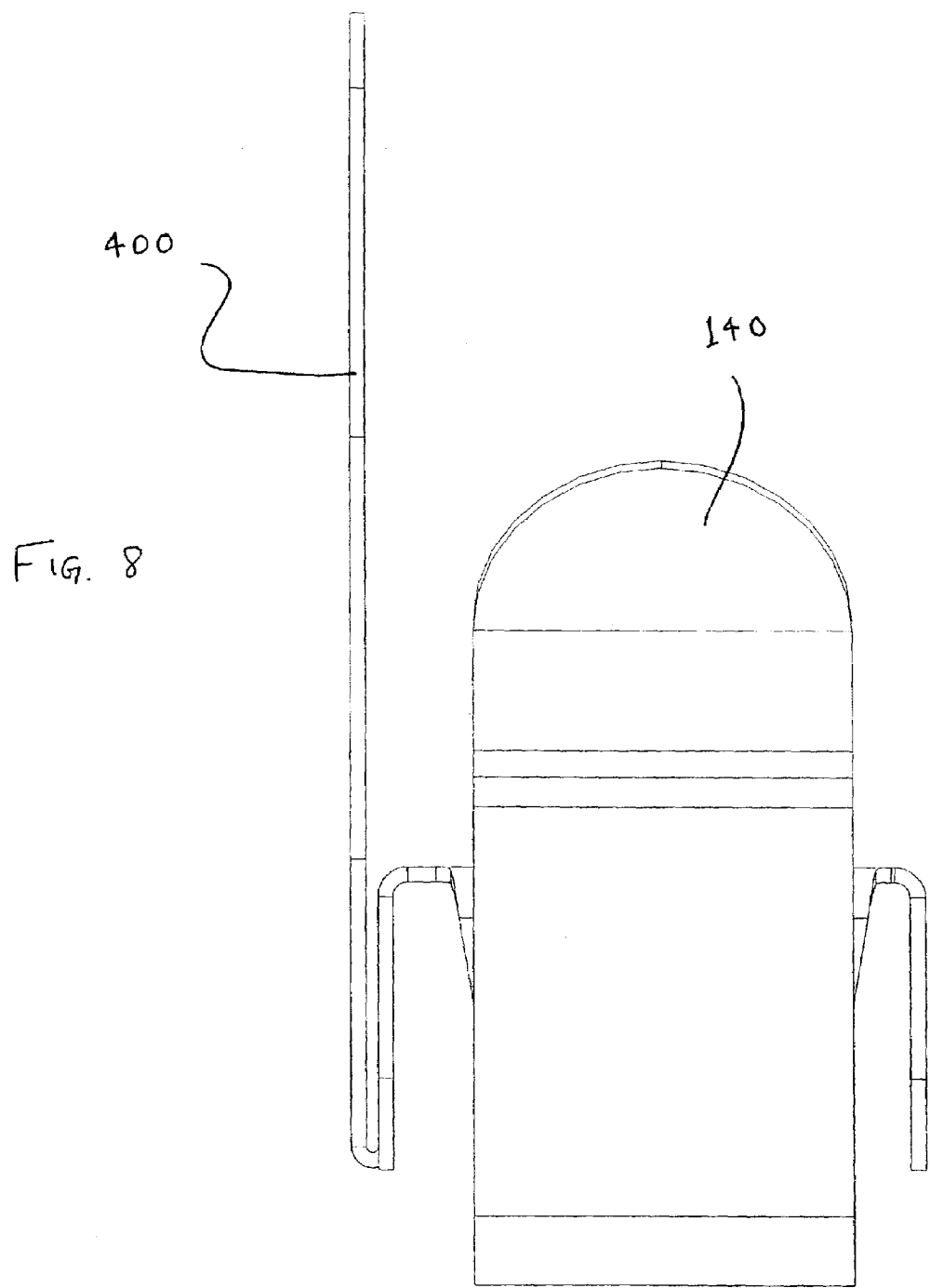
FIG. 8 is an enlarged, top view of the clip shown in FIG. 4.

FIGS. 4–11 and 14–16 show an alternative embodiment of the present invention which includes an arm 400. FIG. 4 shows an embodiment having arm 400 which is sized to extend into the interior of the chassis (discussed below) to interact with a sensor in the chassis (shown, for example, in FIG. 15). Arm 400 is moveable with respect to the sensor as clip 100 pivots at holes 120 and 121 between an operative position in which the arm interacts with the sensor to indicate to the computer that the card is operative and an inoperative position in which the arm interacts with the sensor to indicate to the computer that the card is inoperative. This aspect is shown in more detail below with respect to FIGS. 15–17. FIGS. 5–8 show alternative views of clip 100 shown in FIG. 4, with FIG. 5 being a rotated isometric view, FIG. 6 being a side view, and FIG. 7 being a front view. FIG. 8 is an enlarged top view.

Note also that an opening exists between the two ends of the clip. FIGS. 1 and 4, for example, show opening 160 along most of the length of clip 100 between latch 110 and the lower portion having holes 120 and 121 where clip 100 will be pivotally mounted to the chassis. Opening 160 allows access to the card, where such access is needed, such as where the card is a PCI card or I/O card. Such access has been discovered to be beneficial for making external connections through the opening 160 to the card associated with the opening. It is also beneficial for permitting the flow of cooling air through the interior of the chassis and along the surfaces of the cards therein. This aspect will also be seen more easily in regard to the use of the clip with the chassis as explained in more detail below.

Figure 9:
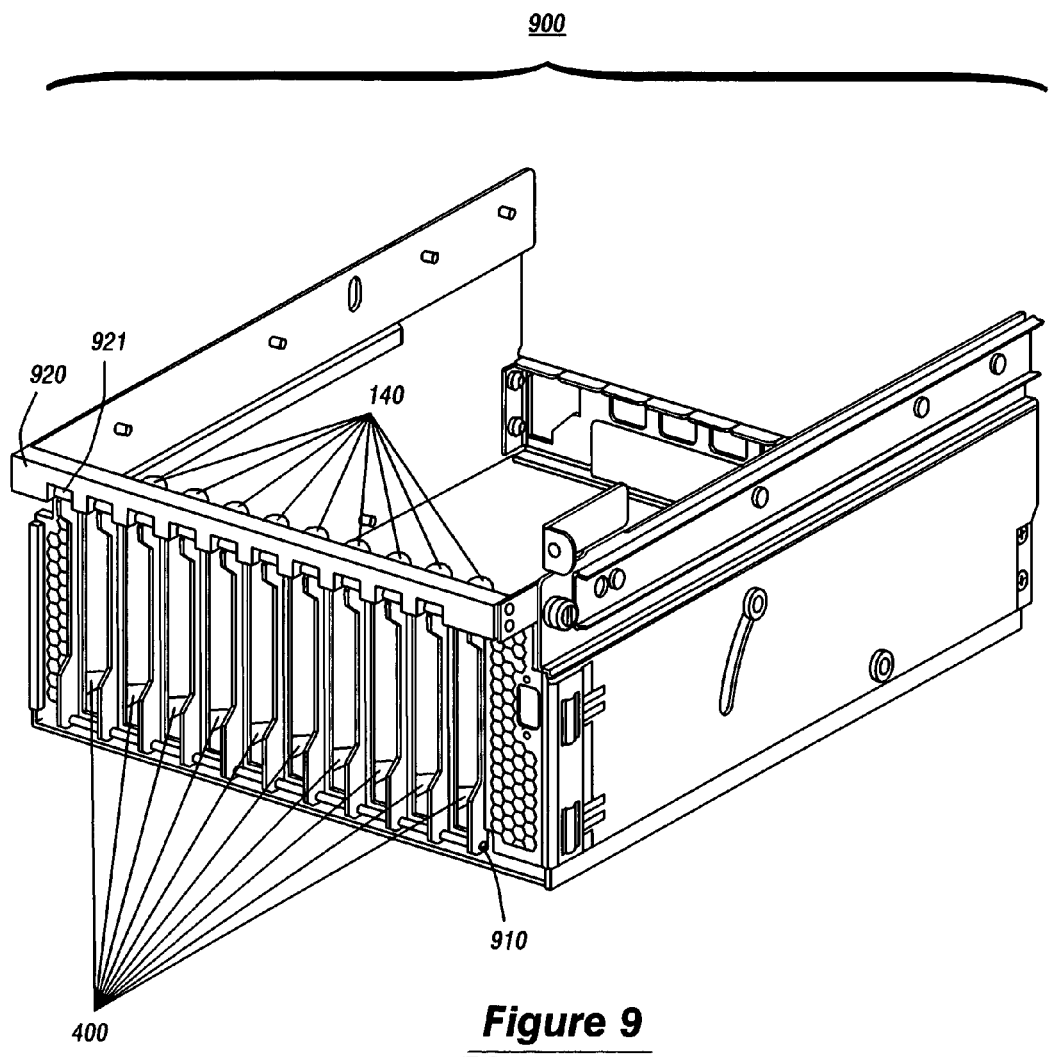
FIG. 9 is a perspective view of an embodiment of a chassis with clips according to the invention in place on a shaft and attached to the chassis.

Turning now to FIG. 9, a chassis 900 having 10 clips 100 in place is shown. Shaft 910 is disposed within holes 120 and 121 along all 10 clips to thereby anchor the clips in place with respect to chassis 900 and also provide a point of rotation for each clip 100. Support bar 920 of chassis 900 is shown with openings 921, one each for each clip 100, to allow the rotation of each clip 100 around shaft 910 and outwardly from the chassis. Partially shown are arms 400 extending into chassis 900.

Figure 10:
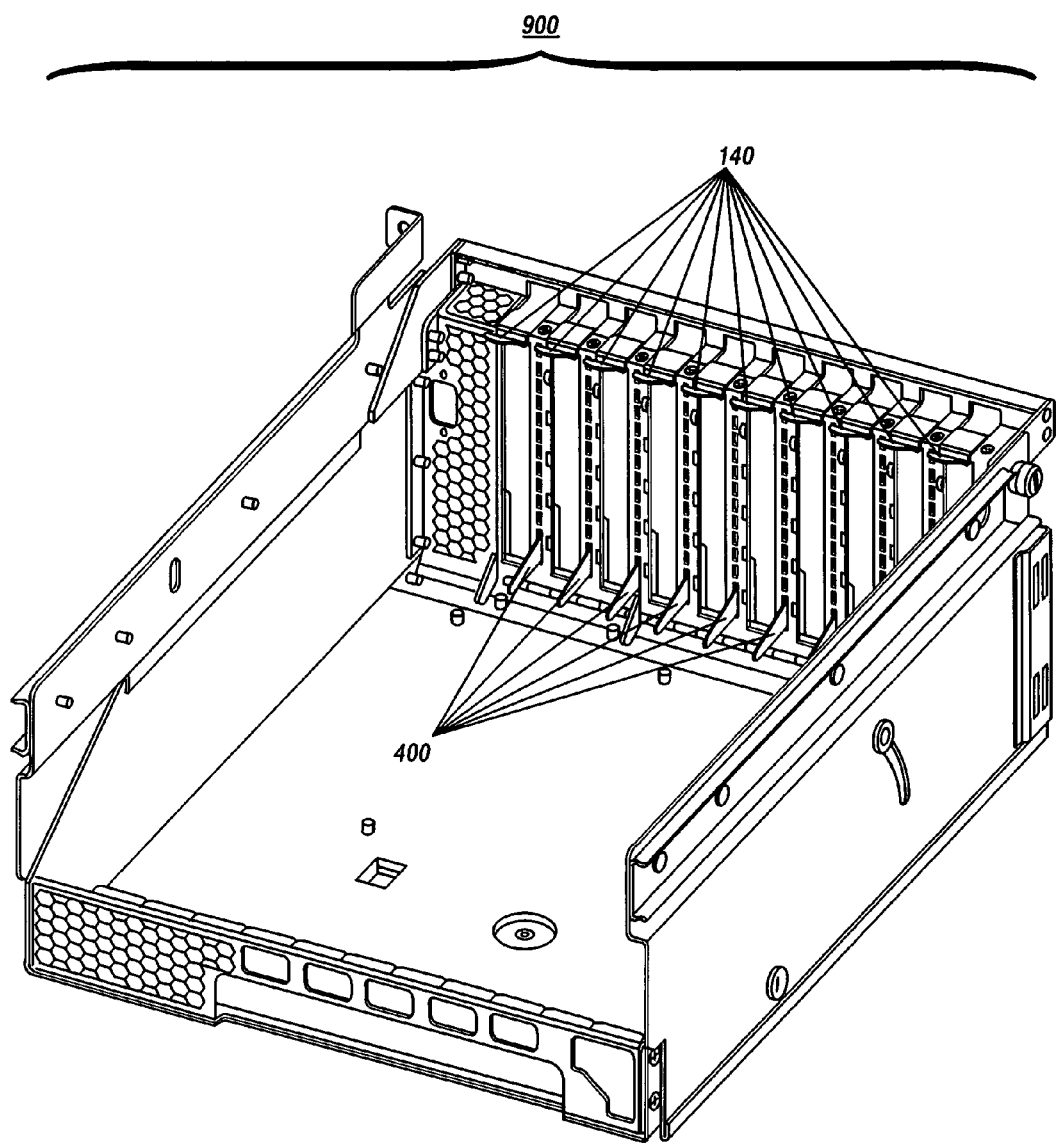
FIG. 10 is an opposite perspective view of the chassis shown in FIG. 9.

FIG. 10 shows the same chassis 900 as that shown in FIG. 9 but from an opposite angle. This view allows a better look at arms 400 extending into the chassis from each clip 100 than that shown in FIG. 9.

Figure 11:
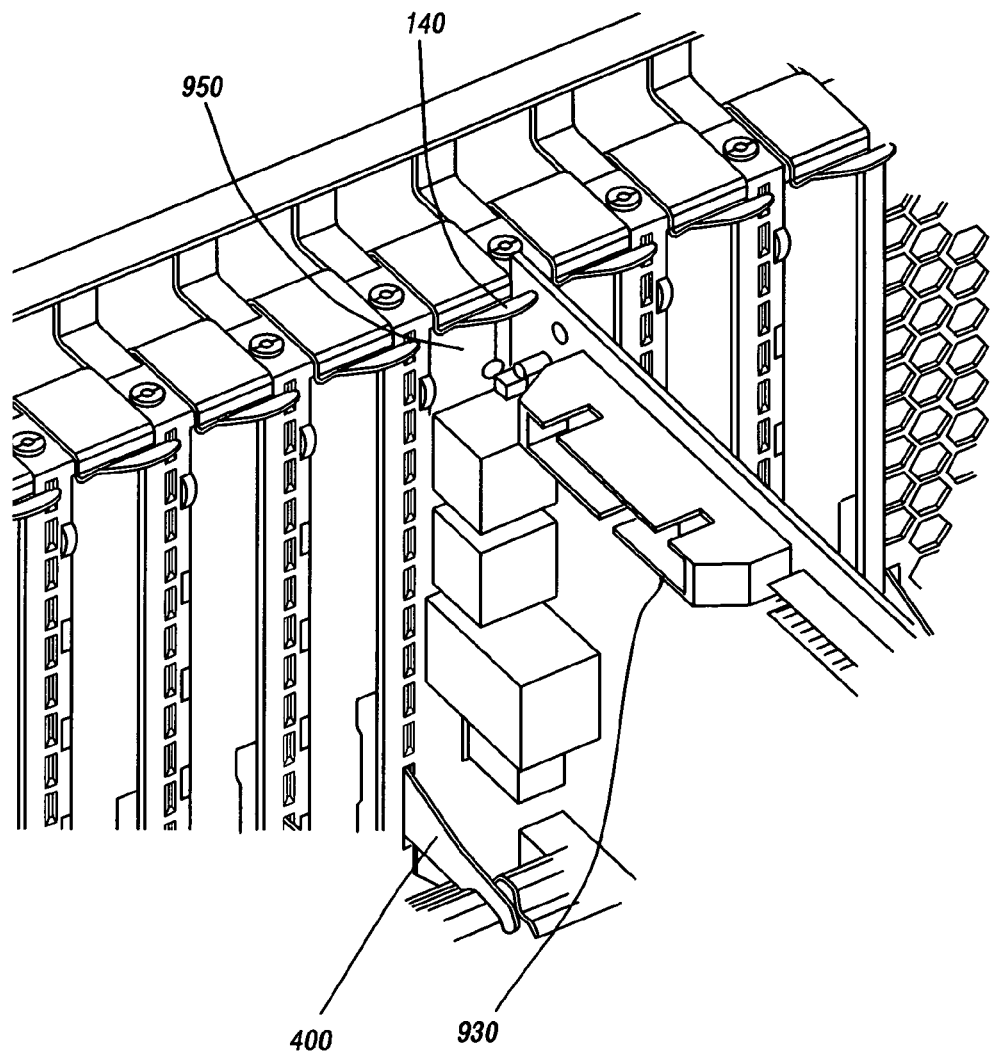
FIG. 11 is a close-up perspective view of the chassis with a card held in place according to aspects of the present invention.
Figure 12:
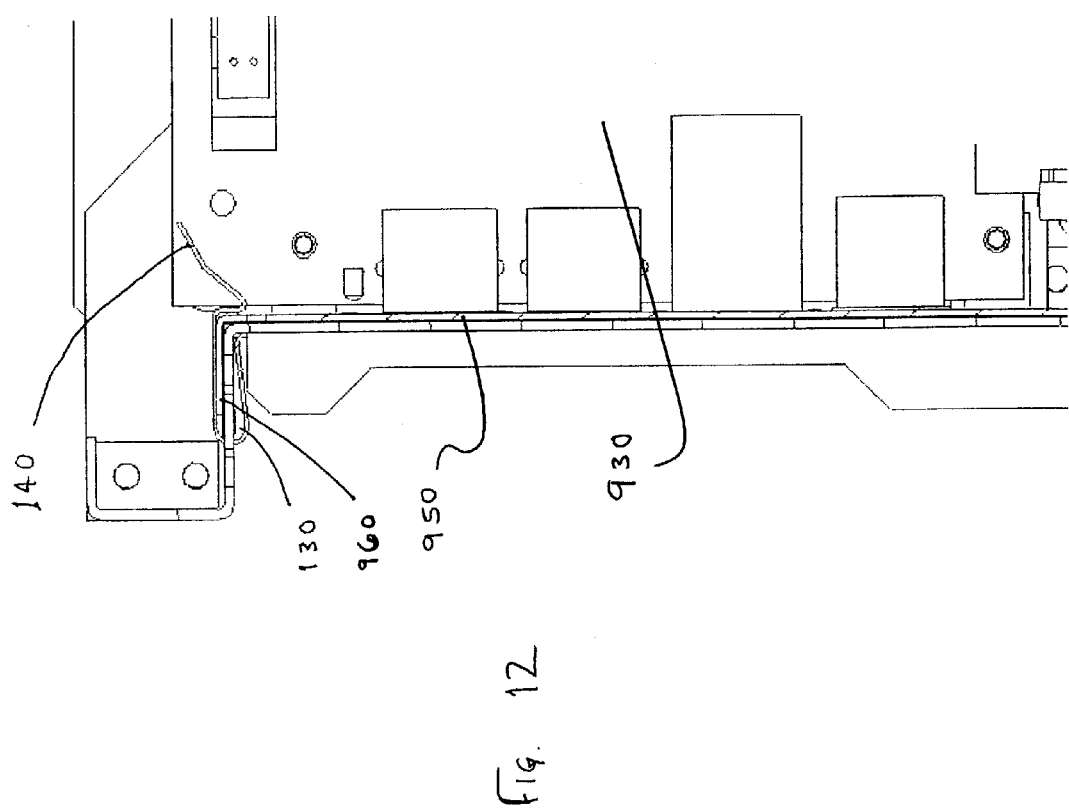
FIG. 12 is a close-up side view of an embodiment of the clip according to aspects of the present invention holding a card in a chassis.

FIG. 11 shows a partial perspective view of chassis 900 with a card 930 in place. Clip 100 is disposed over card portion 950 to thereby hold card 930 within chassis 900. FIG. 12 illustrates a close-up side view of that which is shown in FIG. 11, with card portion 950 more clearly shown extending into recess 130 of latch 110. In this case, card portion 950 is an extension of the card, namely card extension 960 as shown in FIG. 12.

Figure 13:
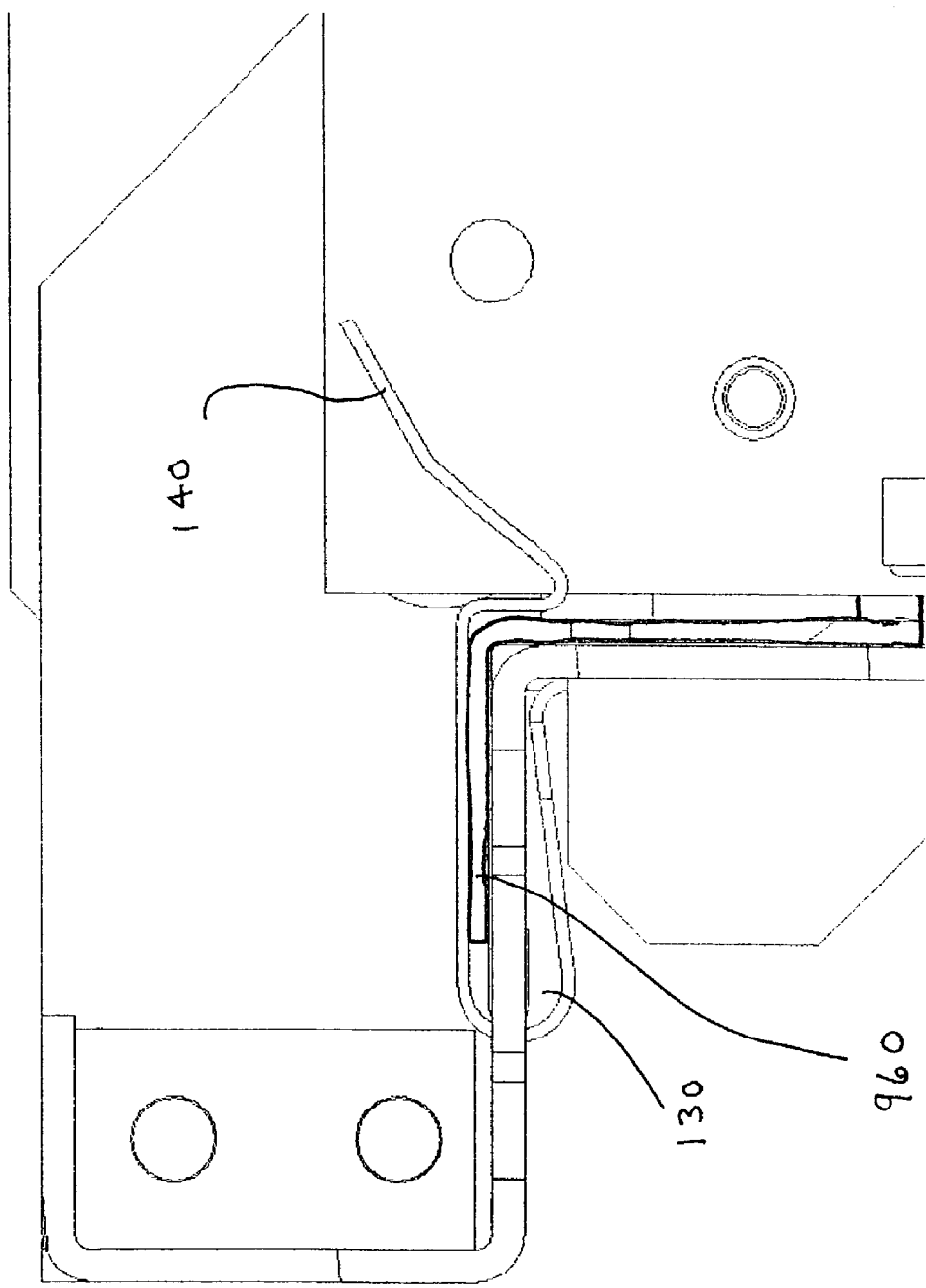
FIG. 13 is an even more close-up view of an exemplary embodiment of a latch portion of the clip holding a card in place in accordance with aspects of the present invention.

FIG. 13 shows an even more-close up view of that shown in FIG. 12. As can be seen more easily in FIG. 13, card extension 960 extends into recess 130 and latch 110, in its biased, closed, securing position, thereby maintains card 930 in place. Note also that, when the clip is in this position, opening 160 allows access to the ends of card 930 so that items may be plugged into the card where, for example, the card is an I/O card. Also, opening 160 provides a path for cooling air flow into or out from the chassis.

Figure 14:
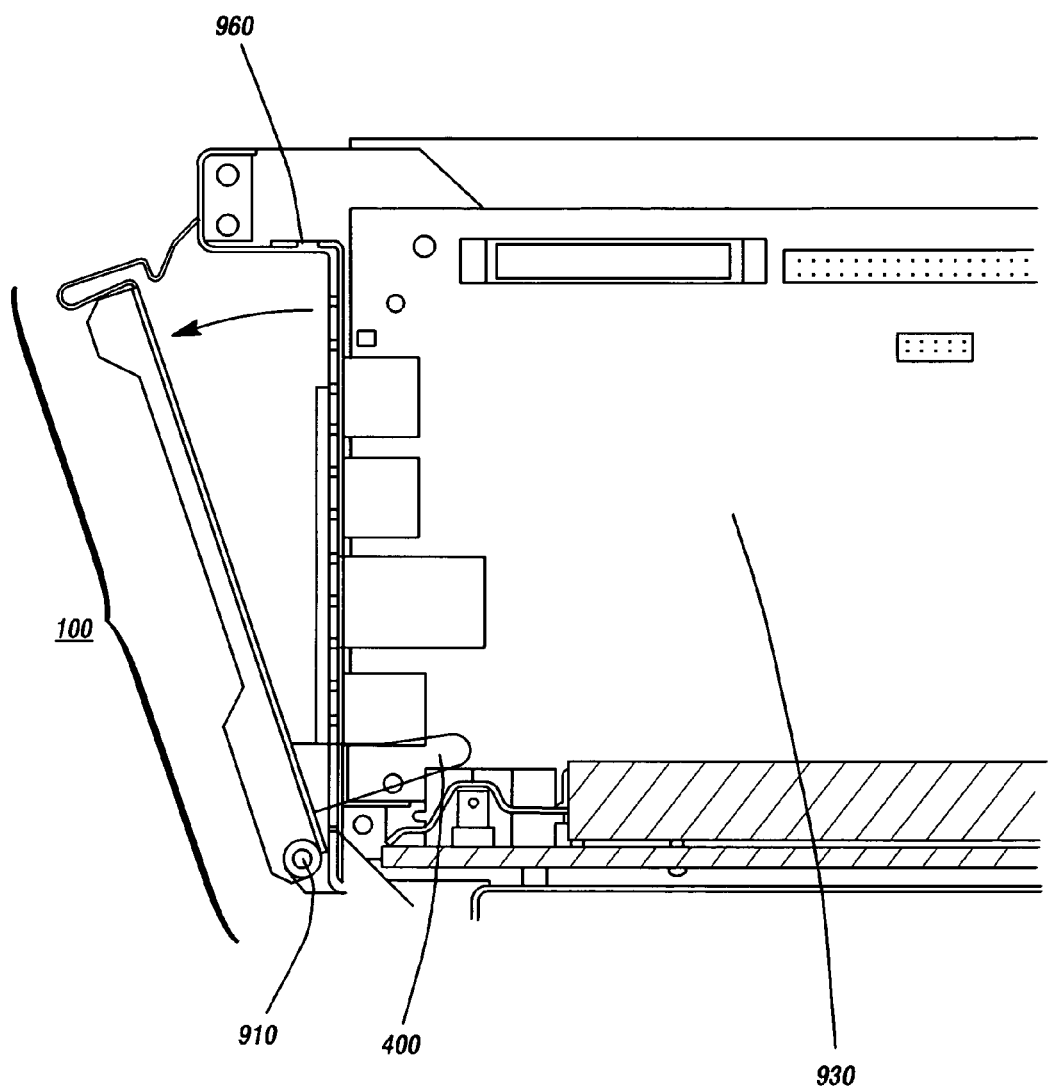
FIG. 14 shows the clip of FIG. 13 being opened to release a card in accordance with aspects of the present invention.

FIG. 14 shows clip 100 in a position after it has released card extension 960 and has been pivoted outward, away from chassis 900. At his point, clip 100 could be further rotated about shaft 910 so that card 930 can be removed from chassis 900. Note how arm 400 pivots up and out of chassis 900. This exemplary feature of the present invention will be addressed in more detail immediately below.

Figure 15:
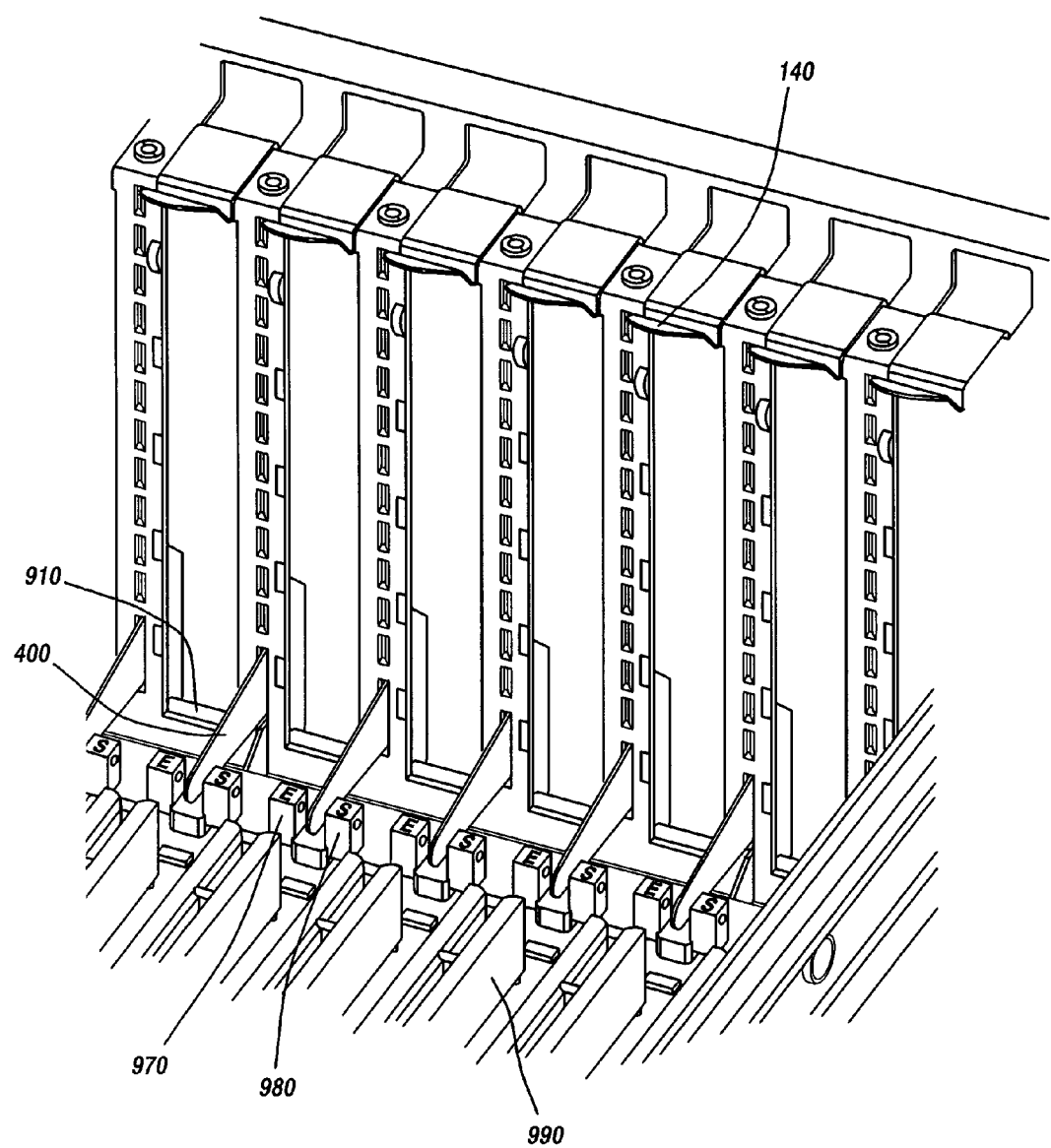
FIG. 15 shows the inside of a chassis showing exemplary embodiments of sensors and the extension of the arm from the clip interacting with the sensors in accordance with aspects of the present invention.

Arm 400, as briefly noted above, and as shown in FIGS. 9–11, extends into chassis 900 when clip 100 is in its closed, securing position. FIG. 15 illustrates several clips 100 with their respective arms 400 disposed within chassis 900. Each arm is disposed to interact with a part of the computer to indicate the presence of the arm or lack of the arm, and thereby communicating to the computer whether the card associated with the arm is in an operative position or ready for removal. This interaction is preferably accomplished through the use of a sensor which interacts with arm 400.

The sensor used would be any of a number known to those skilled in the art, and would be in electronic communication with the computer, preferably the motherboard or operating system. In a more preferred embodiment, such as that shown in FIG. 15, arm 400, when clip 100 is in its closed, securing position, is disposed between two parts of a sensor, an optic beam emitter 970 and an optic beam sensor 980 (shown marked as E and S, respectively). Because arm 400 is disposed on clip 100 as described above and as shown in the many figures, arm 400 is reversibly insertable with respect to the sensor as clip 100 pivots between its two end positions.

More specifically, arm 400 moves between (1) an operative position in which the arm interacts with the sensor to break the optic beam emitted from emitter 970 and prevents it from being sensed by optic beam sensor 980, thereby indicating to the computer that the card is operative, and (2) an inoperative position in which the arm moves out of the path of the optic beam thereby allowing optic beam sensor 980 to receive the optic beam emitted from emitter 970. This later position indicates to the computer that the card is inoperative.

Also shown in FIG. 15 are card receivers 990, one each for each card to be inserted into chassis 900. These card receivers typically interact electronically with the card and, in conjunction with the sensors which interact with arms 400, insure proper card placement, both mechanically and electronically, within the computer chassis before activation or reliance by the computer on the card so placed. Thus, the use of arms 400 and their corresponding sensors, in conjunction with the card receivers 990 and any sensors therein, indicate to the computer that the card is properly in place. Reliance on only sensors in the card receiver 900, however, can cause problems in some circumstances where the system is relying on the card at the moment it is pulled from the chassis.

By utilizing the arms 400 of the present invention and their interaction with appropriate sensors (such as emitters 970 and sensors 980 as discussed herein), a second-level check is insured in addition to any communication through the card receivers 990. Because the system is notified of the deactivation of the card prior to it actually being pulled from the system when clip 100 is swung to its release position (by virtue of arm 400 being simultaneously swung out from between emitter 970 and sensor 980), the system is notified of the deactivation of that card (or imminent deactivation by removal) prior to it actually being removed. Moreover, because of the connection of arm 400 to clip 100, the card cannot be removed from the computer without the system first being notified of its deactivation.

Figure 16:
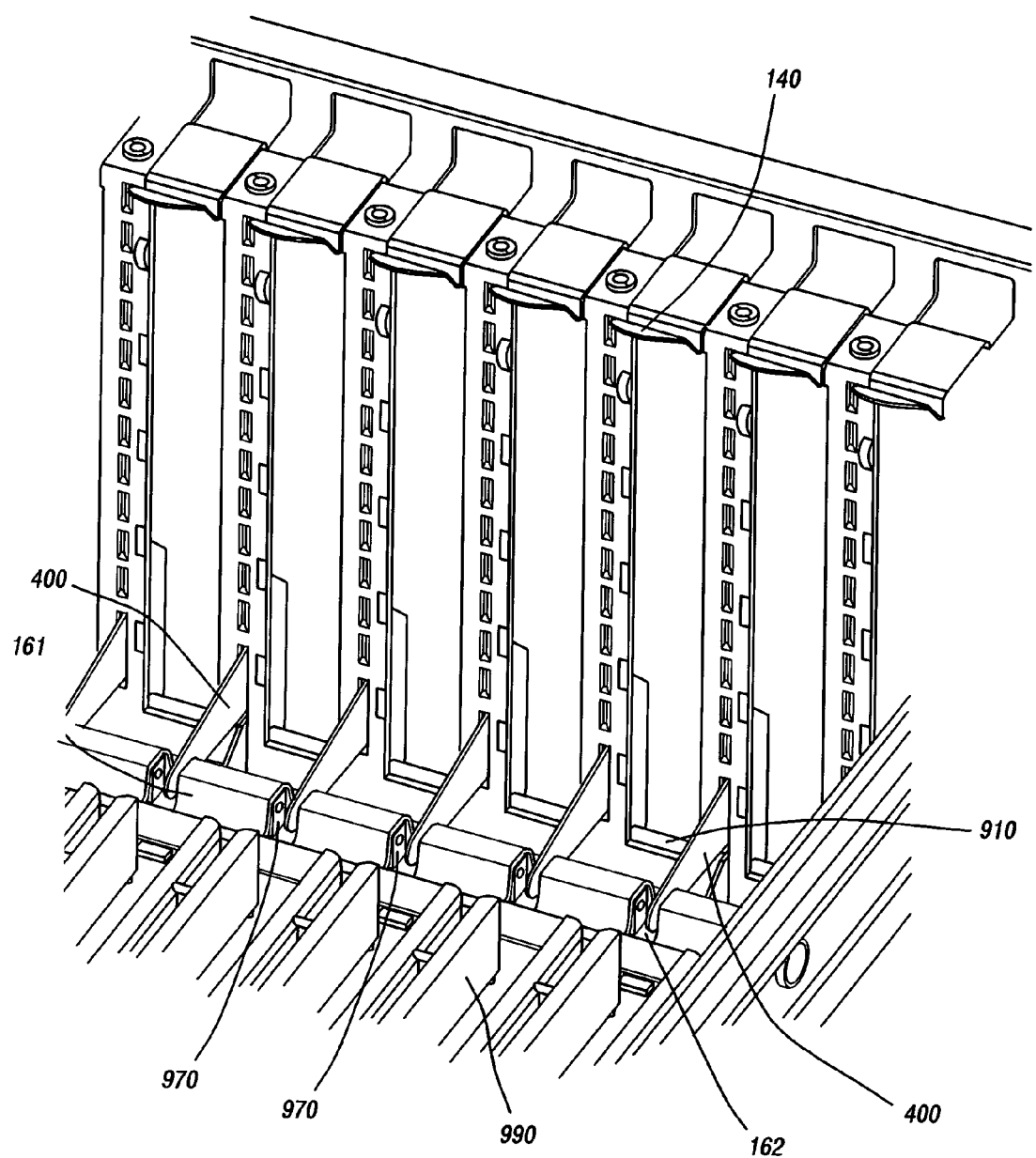
FIG. 16 shows the view of FIG. 15 with the addition of an exemplary embodiment of a cover plate.
Figure 17:
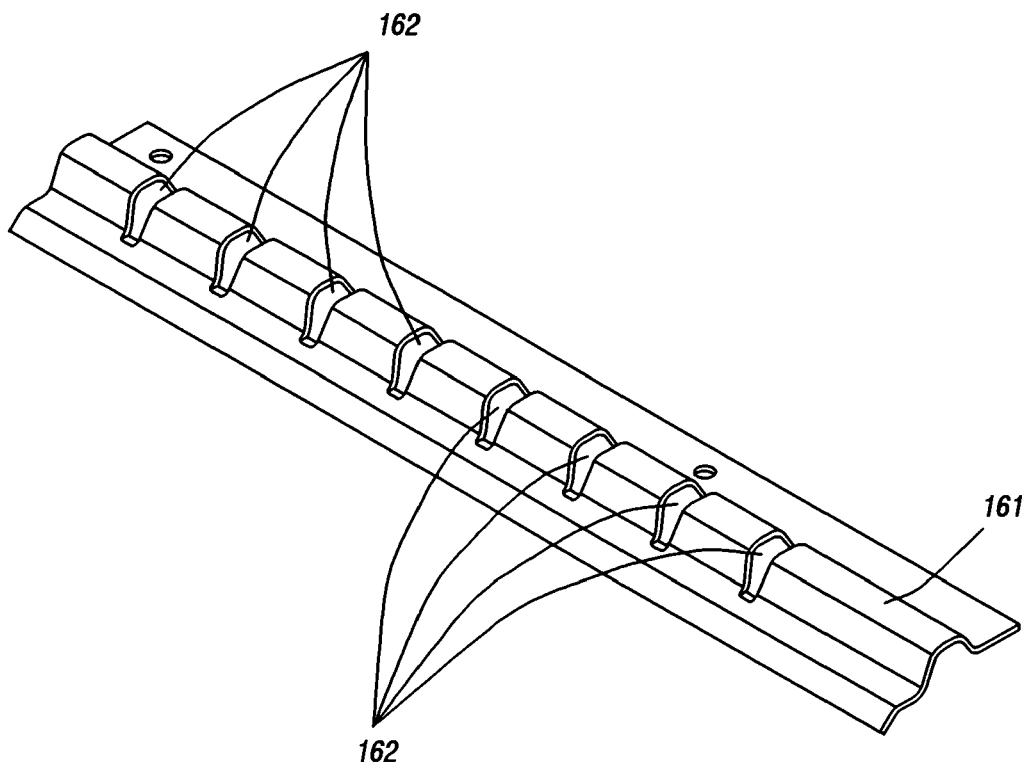
FIG. 17 shows just the cover plate shown in place in the chassis in FIG. 16.

FIG. 16 shows the same view as FIG. 15 but with cover plate 161 in place over top of the sensors. FIG. 16 shows the sides of, for example, optic beam emitters 970 (optic beam sensors being hidden from view at the angle depicted in FIG. 16). Cover plate 161 protects the sensor elements but still allows the interaction discussed above with respect to arms 400 through opening grooves 162. FIG. 17 shows just cover plate 161.

In a preferred embodiment, opening grooves 162 are tapered inward from the top to bottom so as to form a slight funnel effect which can aid in the insertion of each arm 400 as clip 100 is pivoted, or rotated, to its closed, securing position. This can be seen in FIG. 17.

In use, a card 930 can be released from an operating computer by moving the latch 110 of the clip 100 from the securing position to the releasing position and pivoting the clip 100 with respect to the computer from a closed position in which the arm 400 of the clip 100 is detected by the sensor to an open position in which the absence of the arm 400 of the clip 100 is detected by the sensor. The card 930 may then be removed from the computer for replacement or repair.

Generally, the operator of the computer can replace cards during computer operation by moving the latch of the clip from a securing position in which a portion of a card is secured with respect to the computer to a releasing position in which the latch can release the portion of the card. By pulling up on the latch and releasing the card, the operator can then pivot the clip with respect to the computer, from a closed position in which an arm of the clip is detected by a sensor to an open position in which the absence of the arm of the clip is detected by the sensor. By doing so, the operator tells the computer, typically the computer operating system, that he desires to remove that card. After removal of the card, the operator can insert a replacement card where the card removed was placed. To close the system and indicate to the computer that the new card is ready to be used or otherwise relied upon, the operator can pivot the clip back to its closed position in which the arm of the clip is detected by the sensor as indicating that the clip is in its closed position. At this point, the latch of the clip is secured against a portion of the replaced card.

Although the invention is illustrated and described herein with reference to specific embodiments, the invention is not intended to be limited to the details shown. Rather, various modifications may be made in the details within the scope and range of equivalents of the claims and without departing from the invention.

While preferred embodiments of the invention have been shown and described herein, it will be understood that such embodiments are provided by way of example only. Numerous variations, changes and substitutions will occur to those skilled in the art without departing from the spirit of the invention. Accordingly, it is intended that the appended claims cover all such variations as fall within the spirit and scope of the invention.

What is claimed:

1. A computer comprising:
    a chassis (900) at least partially defining an interior for housing at least one card (930);
    a clip (100) having an end portion pivotally mounted to the chassis (900) at a point of rotation, the clip comprised of a latch (110) at an end portion opposite the point of rotation, and further comprised of an arm (400) extending into the chassis (900) when the clip (100) is in its closed position, the arm (400) being positioned on the clip to interact with a sensor (970/980) in the chassis (900) when the clip is in its closed position; and, the latch (110) having a recess (130) to receive a portion of a card which is placed into the chassis (900), the recess being expandable from a securing position in which a portion of a card is secured with respect to the chassis and a releasing position in which the latch can release the portion of the card, wherein the latch (110) is biased in its securing position.

2. The computer of claim 1 wherein the latch (110) is configured to apply a biased force against a portion of a card when the latch is in its securing position.

3. The computer of claim 1 further comprising a card (930), wherein the clip (100) has an opening (160) between the latch (110) and the point of rotation to allow access to the card when the clip is in its closed position.

4. The computer of claim 1 wherein the clip is comprised of stamped metal.

5. The computer of claim 1, wherein the sensor (970/980) is an optical beam sensor positioned to detect the presence or absence of said arm (400) of said clip (100).

6. The computer of claim 1 wherein the recess (130) to receive a portion of a card is shaped to receive a card extension.

7. A computer comprising:
a chassis (900) at least partially defining an interior;
at least one card (930) positioned at least partially within said interior of said housing;
a clip (100) having an end portion pivotally mounted to the chassis (900) at a point of rotation, the clip (100) comprised of a latch (110) at an end portion of the clip (100) opposite the point of rotation and an arm (400) extending into the interior of the chassis, wherein the clip (100) is movable from a latched position in which the latch is engaged and an unlatched position in which the latch is disengaged; and,
a sensor (970/980) coupled to the chassis (900) and positioned to interact with the arm (400) of the clip (100), the arm (400) being moveable with respect to the sensor (970/980) between an operative position in which the arm (400) interacts with the sensor (970/980) to indicate to the computer that the card (930) is operative and an inoperative position in which the arm (400) interacts with the sensor (970/980) to indicate to the computer that the card (930) is inoperative.

8. The computer of claim 7 wherein the latch (110) includes a recess (130) to receive a portion of the card (930), the recess (130) being expandable from a securing position in which a portion of the card (930) is secured with respect to the chassis (900) and a releasing position in which the latch (110) can release the portion of the card, wherein the latch (110) is biased in its securing position.

9. The computer of claim 8 wherein the latch (110) is configured to apply a biased force against a portion of the card (930) when the latch (110) is in its securing position.

10. The computer of claim 8 wherein the clip (100) has an opening (160) between the latch and the point of rotation to allow access to the card (930) when the clip (100) is in its closed position.

11. The computer of claim 8 wherein the card (930) comprises a card extension and the recess (130) to receive a portion of the card (930) is configured to receive the card extension.

12. The computer of claim 8 wherein the sensor (970/980) is positioned to detect the presence of the arm (400) of the clip (100) when the clip (100) is in the engaged position.

13. The computer of claim 8 wherein the sensor is positioned to detect the absence of the arm of the clip when the clip is in the disengaged position.

14. The computer of claim 8 wherein rotation of the clip (100) from the engaged position to the disengaged position moves the arm (400) from the operative position to the inoperative position.

15. The computer of claim 8 wherein the sensor (970/980) comprises an emitter and a receiver and the arm (400) of the clip (100) is extendable to a position between the emitter and receiver of the sensor.

16. The computer of claim 15 wherein the sensor (970/980) is an optical sensor comprising an optical beam emitter and an optical beam receiver and the arm (400) of the clip (100) blocks a beam transmitted from the optical beam emitter when the arm (400) of the clip is positioned in a path between the optical beam emitter and the optical beam receiver.

17. A method of releasing a card (930) from an operating computer, the method comprising the steps of:
moving a latch (11) of a clip (100) from a securing position in which a portion of a card (930) is secured with respect to the computer to a releasing position in which the latch can release the portion of the card; and
pivoting the clip with respect to the computer from a closed position in which an arm (400) of the clip is detected by a sensor (970/980) to an open position in which the absence of the arm (400) of the clip (100) is detected by the sensor.

18. The method of claim 17 further comprising the step of removing the card after the latch of the clip is moved to its releasing position.

19. The method of claim 17 further comprising the step of removing the card after the clip is moved to its open position.

20. The method of claim 17 further comprising the step of communicating to the computer that a card is to be removed before pivoting the clip to its open position.

21. A method of replacing a card (930) in a computer, the method comprising the steps of:
moving a latch (110) of a clip (100) from a securing position in which a portion of a card (930) is secured with respect to the computer to a releasing position in which the latch can release the portion of the card;
pivoting the clip, with respect to the computer, from a closed position in which an arm (400) of the clip is detected by a sensor (970/980) to an open position in which the absence of the arm (400) of the clip (100) is detected by the sensor;
removing the card after the clip (100) is pivoted to its open position;
inserting a replacement card where the card removed was placed; and
pivoting the clip back to its closed position in which the arm (400) of the clip (100) is detected by the sensor as indicating that the clip is in its closed position.

* * * * *